(12) United States Patent
Sun

(10) Patent No.: US 9,824,891 B1
(45) Date of Patent: Nov. 21, 2017

(54) METHOD OF MANUFACTURING THE THIN FILM

(71) Applicant: Shenyang Silicon Technology Co., Ltd., Liaoning (CN)

(72) Inventor: Wei Sun, Beijing (CN)

(73) Assignee: Shenyang Silicon Technology Co., Ltd., Liaoning (CN)

(*) Notice: Subject to any disclaimer, the term of this patent is extended or adjusted under 35 U.S.C. 154(b) by 0 days.

(21) Appl. No.: 15/358,517

(22) Filed: Nov. 22, 2016

(30) Foreign Application Priority Data

Nov. 1, 2016 (CN) .......................... 2016 1 0986988

(51) Int. Cl.
| | | |
|---|---|---|
| H01L 21/00 | (2006.01) |
| H01L 21/02 | (2006.01) |
| H01L 21/324 | (2006.01) |
| H01L 21/265 | (2006.01) |
| H01L 21/30 | (2006.01) |
| H01L 21/306 | (2006.01) |

(52) U.S. Cl.
CPC .... *H01L 21/0262* (2013.01); *H01L 21/02065* (2013.01); *H01L 21/02532* (2013.01); *H01L 21/02592* (2013.01); *H01L 21/26513* (2013.01); *H01L 21/3003* (2013.01); *H01L 21/30625* (2013.01); *H01L 21/324* (2013.01)

(58) Field of Classification Search
None
See application file for complete search history.

(56) References Cited

U.S. PATENT DOCUMENTS

| | | | |
|---|---|---|---|
| 2015/0115480 A1* | 4/2015 | Peidous | H01L 21/76251 257/798 |
| 2016/0071959 A1* | 3/2016 | Thomas | H01L 29/66833 257/324 |
| 2016/0351437 A1* | 12/2016 | Peidous | H01L 21/76251 |

* cited by examiner

*Primary Examiner* — Bradley K Smith
(74) *Attorney, Agent, or Firm* — Maier & Maier, PLLC

(57) ABSTRACT

The invention disclosed a method of manufacturing the thin film, which belongs to the technological field of SOI wafer manufacture. By growing a layer of dielectric material (silicon oxide) on the provided high-resistivity silicon wafer, then to grow a layer of amorphous silicon on the dielectric material, to transfer a layer of silicon oxide to the amorphous silicon, to make the mono crystalline silicon exist on the oxidation layer, so that a SOI wafer with a layer of amorphous silicon is manufactured. The process above is completed in specific process conditions. The manufactured thin film, e.g. SOI wafer with amorphous silicon layer, is used main for RF apparatus.

9 Claims, 1 Drawing Sheet

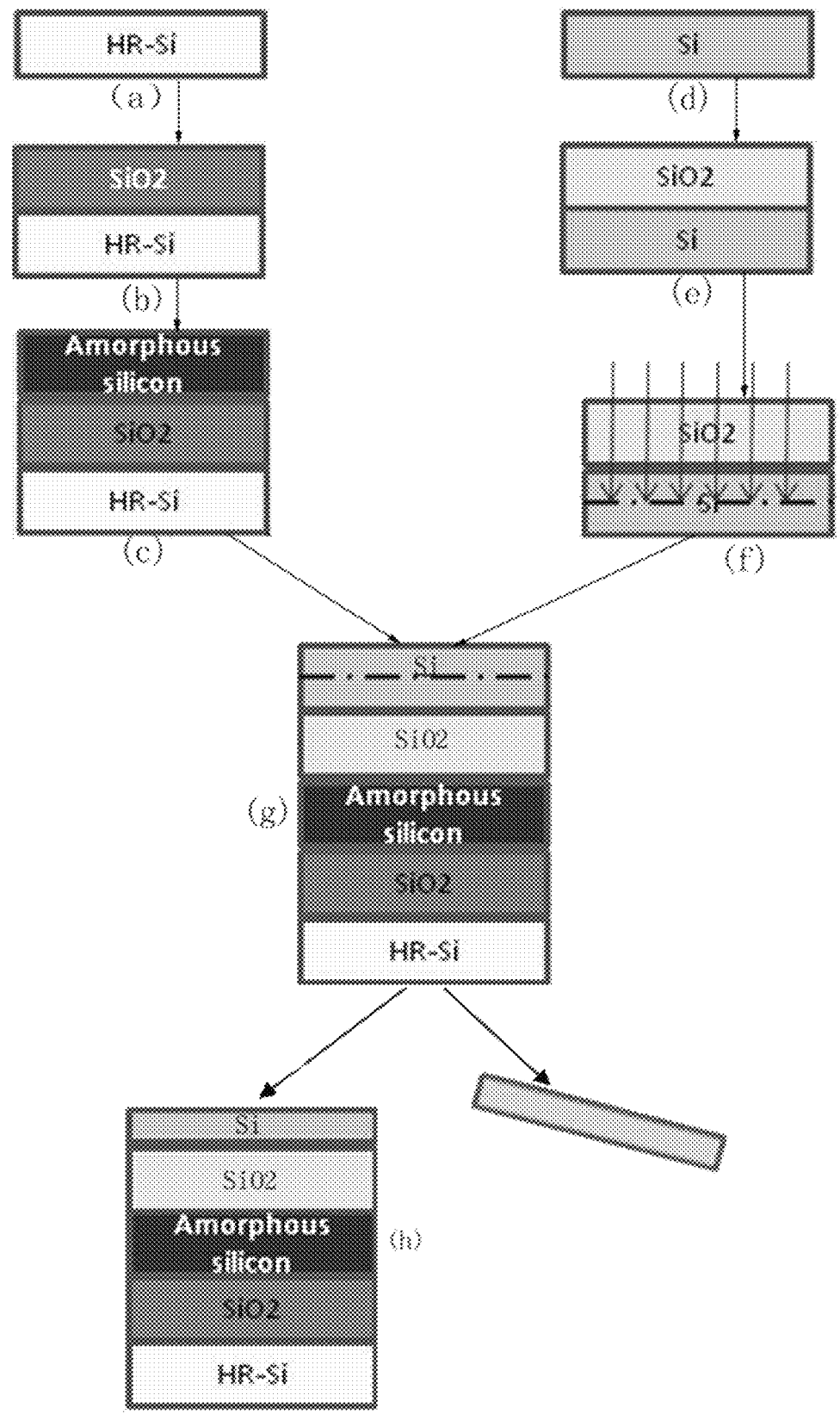

METHOD OF MANUFACTURING THE THIN FILM

TECHNICAL FIELD

The present invention relates to the field of the manufacture technology of SOI wafer, more particularly relates to a method of manufacturing the thin film, the manufactured film is used main for RF apparatus.

BACKGROUND TECHNOLOGY

Materials currently used in RF front end modules are as follows:

1. SOQ (silicon on quartz), SOS (silicon on sapphire): SOQ is as same as traditional SOI (silicon-on-insulator), which generate a lower leakage current, since its lower parasitic capacitance, the circuit performance under high frequency is enhanced. The advantage of SOS is its extremely good electrical insulation, which can effectively prevent radiation caused by stray currents from spreading to nearby elements. The substrates like SOQ and SOS can get excellent RF performance, but this kind of structure is very rare, so they are very expensive.

2. High-resistivity silicon substrates: the resistivity of it is more than 500 ohm·cm, this kind of substrate is worse than the first, this kind of substrate is not benefiting from the structure advantages of SOI type, but they cost less.

3. High-resistivity SOI substrate: this kind of substrate has structural advantages, but the performance is worse than the first.

A reason of the formation of low-resistivity layer is: due to the existing of pollutants on the surface of the low-resistivity layer before bonding, during the process of bonding, these pollutants is packaged in the bond interface and can diffuse to the high-resistivity substrate; another reason of the formation of low-resistivity layer is: the high content of oxygen atoms in the substrate, so it's necessary to perform a heat treatment, to precipitate the oxygen atoms to get the high-resistivity substrate. However, the diffusion of oxygen atoms and the process of heat treatment lead to the low resistivity of the surface of the formed substrate. It is difficult to control the two reasons now.

4. Based on the 3, the high-resistivity SOI substrate is improved by adding defect layer: to achieve the purpose, lots of techniques are tried, but there are some disadvantages: sensitive to SOI manufacturing and generating heat in the subsequent process of IC components fabrication, not easy to make materials with good thermal stability.

SUMMARY OF THE INVENTION

The purpose of this invention is aimed at the insufficiency of existing technology to provide a method of manufacturing the thin film, the thin film refers to the SOI wafer with amorphous silicon layer, the amorphous silicon layer is referenced in the SOI wafer, and the effective combination of amorphous silicon and silicon oxide can effectively inhibit the parasitic conductivity of the surface of the silicon substrate, limit the changes of capacity and reduce the generated harmonic power, so that reduce the loss of resistivity of high-resistivity SOI substrate to minimum.

To achieve the purpose above, the technological schemes used by the invention is as follow:

A method of manufacturing thin film, which is the method of manufacturing the SOI wafer with amorphous silicon layer, includes the steps below:

(1) providing a high-resistivity silicon wafer (the resistivity of the silicon wafer is greater than 1000 ohm·cm), manufacturing silicon oxide layer and amorphous silicon layer on its surface after cleaning in order, the thickness of silicon oxide layer is 150-300 angstroms, the thickness of amorphous silicon layer is 1-5 μm; wherein cleaning the high-resistivity silicon wafer by using DHF (dilute hydrofluoric acid), SC1 (a mixture of ammonium hydroxide ($NH_4OH$), hydrogen peroxide ($H_2O_2$), and DI water ($H_2O$)) and SC2 (a mixture of hydrochloric acid (HCl), hydrogen peroxide ($H_2O_2$), and DI water ($H_2O$)) in order, to remove the natural oxide layer and pollutants on the surface of the silicon wafer, then manufacturing silicon oxide layer on the surface of the high-resistivity silicon wafer.

The process for manufacturing silicon oxide layer on the surface of high-resistivity silicon wafer is that: putting the high-resistivity silicon wafer in the oxidation oven, the oxidation temperature is 1060-1150° C., manufacturing the silicon oxide layer of required thickness by controlling the oxidation time, then cleaning by using SC1 and SC2 in order, to remove the pollutant on the surface.

After manufacturing silicon oxide layer on the surface of the high-resistivity silicon wafer, manufacturing amorphous silicon layer on the surface of the silicon oxide layer, manufacturing amorphous silicon layer is by the method of LPCVD (Low Pressure Chemical Vapor Deposition), wherein the growth pressure is 0.1-5.0 Torr, and the reaction temperature is 300° C.-900° C.; cleaning the high-resistivity silicon wafer after manufacturing amorphous silicon layer by using SC1 and SC2 in order, to remove the impurity on the surface.

(2) providing a low-resistivity silicon wafer (the resistivity of the silicon wafer is less than 1000 ohm·cm), manufacturing silicon oxide layer on its surface after cleaning, the thickness of silicon oxide layer is 2000-10000 angstroms; wherein:

the low-resistivity silicon wafer is cleaned by using DHF, SC1 and SC2 in order, to remove the natural oxidation layer and the pollutant on the surface of the silicon wafer, and then the silicon oxide layer is manufactured on the surface of the low-resistivity silicon wafer.

The process for manufacturing silicon oxide layer on low-resistivity silicon wafer is that: putting the low-resistivity silicon wafer in the oxidation oven, the oxidation temperature is 950-1020° C., controlling the thickness of the obtained silicon oxide layer according to the oxidation time; and then cleaning the low-resistivity silicon wafer with manufactured silicon oxide layer by using SC1 and SC2 in order, to remove the pollutant on the surface.

(3) performing hydrogen ions implantation to the low-resistivity silicon wafer with silicon oxide layer manufactured in step (2), to make hydrogen ions penetrate the silicon oxide layer into the silicon wafer and reach the required depth, and then cleaning by using SPM (a mixture of sulfuric acid ($H_2SO_4$), hydrogen peroxide ($H_2O_2$), and DI water ($H_2O$)), DHF, SC1, SC2 in order;

(4) making the high-resistivity silicon wafer processed by step (1) and the low-resistivity silicon wafer processed by step (3) into a whole by bonding method, and then performing annealing process in the condition of 200-450° C., after annealing, cleaning the whole after bonding by using SC1, SC2 in order;

(5) separating the whole bonded by step (4) by microwave separating apparatus, the separating temperature is below 400° C., so that the SOI wafer with amorphous layer is obtained;

(6) cleaning the SOI wafer with amorphous layer obtained by separating, the cleaning is: cleaning by using SPM, DHF, SC1 and SC2 in order, to remove the silicon slag and other pollutants on the surface of SOI; and then performing annealing process in the condition of 1000-1500° C. after cleaning;

(7) cleaning the SOI wafer with amorphous layer processed by annealing of step (6) by using DHF, to remove the oxidation layer brought by high temperature annealing, then using SC1, SC2 in order to remove chemical liquid and surface pollutants, finally performing CMP (chemical mechanical polishing) process, to make its top layer silicon reach the required thickness, that is to get the finish product of SOI wafer with amorphous layer of required specification.

The SOI wafer with amorphous silicon layer manufactured by the invention has the following advantages:

1. The technological advantage of the combination of amorphous silicon and silicon oxide is high defect density. The application of combined layer of amorphous silicon and silicon oxide effectively inhibits the parasitic conductivity of the surface of the silicon substrate, limit the changes of capacity and reduce the generated harmonic power.

2. Amorphous layer frozen carrier makes the silicon material become real high resistivity. Reduce the PSC (parasitic surface-conduction) of the high resistivity SOI substrate.

3. The advantage of the amorphous silicon technology of present invention is high defect density, and the application of the amorphous silicon layer of high thermal stability is compatible with the bonding process. Block the potential under the oxide layer, limit the changes of capacity and reduce the generated harmonic power.

4. Amorphous layer high-resistivity SOI substrate reduces RF substrate loss, amorphous layer+high-resistivity silicon increase the linearity of the substrate, amorphous layer high-resistivity SOI substrate reduces the DC voltage bias, and is compatible with CMOS, reduces RF loss.

5. The present invention can manufacture high-quality components with low manufacturing cost.

BRIEF DESCRIPTION OF THE FIGURES

FIG. 1 is a diagram of process flow of the invention; wherein: (a) high-resistivity silicon wafer; (b) manufacture of a silicon oxide layer; (c) manufacture of an amorphous silicon layer; (d) low-resistivity silicon wafer; (e) manufacture of a low-resistivity silicon wafer with silicon oxide layer; (f) hydrogen ion implantation; (g) bonding; (h) microwave separating.

DETAILED DESCRIPTION

Following is the detailed description of certain exemplary embodiments of the present invention with reference to the attached drawings.

Embodiment 1

The present embodiment provides a method of manufacturing thin film, wherein the thin film is a SOI wafer with amorphous silicon layer, and the manufacture includes the steps below:

1. Provide a high-resistivity silicon wafer, of which the resistivity is greater than 1000 ohm·cm, and clean its surface by using DHF, SC1 and SC2 in order, to remove the natural oxidation layer and the pollutant on the surface of the silicon wafer; using the test apparatus to test the condition of particles on the surface of silicon wafer, the silicon wafers which meet the requirement will come into the next step (FIG. 1(a)).

2. Refer to FIG. 1(b), manufacture silicon oxide layer on the surface of high-resistivity silicon wafer, the thickness of the grown oxide layer is about 200 angstroms; the process for manufacturing is that: put the high-resistivity silicon wafer in the oxidation oven, the oxidation temperature is about 1100° C., then clean by using SC1 and SC2 in order, to remove the pollutant on the surface. Use the test apparatus to test the condition of particles on the surface of silicon wafer, use the test apparatus to test the thickness of silicon oxide and other parameters (such as the particles of silicon oxide layer, electrical parameters), the silicon wafers which meet the requirement will come into the next step.

3. Based on FIG. 1(b), by the method of LPCVD (Low Pressure Chemical Vapor Deposition), wherein the growth pressure is 0.1-5.0 Torr, and the reaction temperature is 300° C.-900° C., manufacture the amorphous silicon layer on the silicon oxide layer (FIG. 1(c)), the thickness of the amorphous silicon layer is 1-5 μm; the high-resistivity silicon wafer after manufacturing amorphous silicon layer is cleaned by using SC1 and SC2 in order, to remove the impurity on the surface. Use the test apparatus to test the thickness of grown amorphous silicon, the silicon wafers whose thickness is in the range mentioned above will come into the next step.

4. Provide low-resistivity silicon wafer (the resistivity is less than 100 ohm·cm), clean by using DHF, SC1 and SC2 in order, to remove the natural oxidation layer and the pollutant on the surface of the silicon wafer (FIG. 1(d)). Use the test apparatus to test whether the particles on the surface are qualified and the condition of geometry parameters, select qualified wafers to perform the next step.

5. Manufacture silicon oxide layer on low-resistivity silicon wafer in step (4), the process of manufacturing is that: put the low-resistivity silicon wafer in the oxidation oven, the oxidation temperature is about 1000° C.; clean the low-resistivity silicon wafer with manufactured silicon oxide layer by using SC1 and SC2 in order, to remove the pollutant on the surface (FIG. 1(e)). Use the test apparatus to test the thickness of the oxide layer and the surface state of the obtained silicon wafers, select proper silicon oxide wafer to perform the next step.

6. Perform hydrogen ions implantation to the low-resistivity silicon wafer with silicon oxide layer manufactured in step (5), to make hydrogen ions penetrate the silicon oxide layer into the silicon wafer and reach the required depth (FIG. 1(f)), then clean by using SPM, DHF, SC1, SC2 in order. Test silicon wafers, select qualified silicon wafers to perform the next step.

7. Make the high-resistivity silicon wafer processed by step (3) and the low-resistivity silicon wafer processed by step (6) into a whole by bonding, then perform low temperature annealing; the annealing temperature is 200-450° C., increase the bonding strength between wafers by annealing (FIG. 1(g)); then perform SONOSCAN D9600™ C-SAM test, SONOSCAN D9600™ C-SAM test, after the tests, clean by using SC1, SC2 in order. Select qualified silicon wafers which are without holes after bonding to perform the next step.

8. Separate the whole bonded by step (7) by microwave separating apparatus, the separating temperature is below 400° C., so that the SOI wafer with amorphous layer is obtained (FIG. 1(h)). The opposite silicon can be reused after separation (the silicon wafer will discard when the thickness could not meet the requirement.). The microwave separating apparatus is an apparatus disclosed in Chinese patent application No. 201220360782.6, whose name is a microwave separating apparatus.

9. Clean the SOI wafer with amorphous layer obtained by separating by using SPM, DHF, SC1 and SC2 in order, to remove the silicon slag and other pollutants on the surface of SOI. Perform the film thickness test (testing the thickness of the top layer of silicon), select qualified SOI to perform the next step.

10. Perform high temperature annealing on the SOI wafer with amorphous layer after cleaning, the annealing temperature is 1000-1500° C., to remove injury from injection, repair the lattice.

11. Use DHF to clean the SOI wafer with amorphous layer processed by step (10), to remove the oxidation layer brought by high temperature annealing, then use SC1, SC2 in order to remove chemical liquid and surface pollutants.

12. Perform CMP process on the SOI wafer with amorphous layer processed by step (11), so that the top layer silicon reaches required thickness. Then perform various tests (for example, surface metals, particles, geometric parameters, resistivity, film thickness, roughness, etc).

The invention claimed is:

1. A method of manufacturing thin film, wherein the thin film is a SOI (silicon-on-insulator) wafer with an amorphous silicon layer, and the method of manufacturing comprising the steps of:
   (1) providing a high-resistivity silicon wafer, manufacturing a first silicon oxide layer and the amorphous silicon layer on its surface in order after cleaning, wherein the thickness of the first silicon oxide layer is 150-300 angstroms, the thickness of the amorphous silicon layer is 1-5 μm;
   (2) providing a low-resistivity silicon wafer, manufacturing a second silicon oxide layer on its surface after cleaning, wherein the thickness of the second silicon oxide layer is 2000-10000 angstroms;
   (3) performing hydrogen ions implantation to the low-resistivity silicon wafer with the second silicon oxide layer manufactured in step (2), to make hydrogen ions penetrate the second silicon oxide layer into the silicon wafer and reach the required depth, then cleaning by using SPM (a mixture of sulfuric acid ($H_2SO_4$), hydrogen peroxide ($H_2O_2$), and DI water ($H_2O$)), DHF (dilute hydrofluoric acid), SC1 (a mixture of ammonium hydroxide ($NH_4OH$), hydrogen peroxide ($H_2O_2$), and DI water ($H_2O$)), SC2 (a mixture of hydrochloric acid (HCl), hydrogen peroxide ($H_2O_2$), and DI water ($H_2O$)) in order;
   (4) making the high-resistivity silicon wafer processed by step (1) and the low-resistivity silicon wafer processed by step (3) into a whole by bonding method, and then performing annealing process in the condition of 200-450° C., after annealing, cleaning the whole after bonding by using SC1, SC2 in order;
   (5) separating the whole bonded by step (4) by microwave separating apparatus, the separating temperature is below 400° C., so that the SOI wafer with the amorphous layer is obtained;
   (6) cleaning the SOI wafer with the amorphous layer obtained by separating, then performing annealing process in the condition of 1000-1500° C.; and
   (7) cleaning the SOI wafer with the amorphous layer processed by annealing of step (6) by using DHF, to remove the oxidation layer brought by high temperature annealing, then using SC1, SC2 in order to remove chemical liquid and surface pollutants, finally performing CMP (chemical mechanical polishing) process, to make its top layer silicon reach the required thickness, that is to get the finish product of the SOI wafer with the amorphous layer of required specification.

2. The method of manufacturing thin film of claim 1, wherein in step (1), the high-resistivity silicon wafer refers to the silicon wafer of which the resistivity is greater than 1000 ohm·cm.

3. The method of manufacturing thin film of claim 1, wherein in step (1), cleaning the high-resistivity silicon wafer by using DHF, SC1 and SC2 in order, to remove the natural oxidation layer and the pollutant on the surface of the silicon wafer, and then manufacturing the first silicon oxide layer on the surface of the high-resistivity silicon wafer.

4. The method of manufacturing thin film of claim 1, wherein in step (1), the process for manufacturing the first silicon oxide layer on the surface of high-resistivity silicon wafer comprises: putting the high-resistivity silicon wafer in the oxidation oven where the oxidation temperature is 1060-1150° C., manufacturing the first silicon oxide layer of required thickness by controlling the oxidation time, and then cleaning by using SC1 and SC2 in order, to remove the pollutant on the surface.

5. The method of manufacturing thin film of claim 1, wherein in step (1), after manufacturing the first silicon oxide layer on the surface of the high-resistivity silicon wafer, manufacturing the amorphous silicon layer on the surface of the first silicon oxide layer, manufacturing the amorphous silicon layer is by the method of LPCVD (Low Pressure Chemical Vapor Deposition), wherein the growth pressure is 0.1-5.0 Torr, and the reaction temperature is 300° C.-900° C.; cleaning the high-resistivity silicon wafer after manufacturing the amorphous silicon layer by using SC1 and SC2 in order, to remove the impurity on the surface.

6. The method of manufacturing thin film of claim 1, wherein in step (2), the low-resistivity silicon wafer refers to the silicon wafer of which the resistivity is less than 100 ohm·cm.

7. The method of manufacturing thin film of claim 1, wherein in step (2), cleaning the low-resistivity silicon wafer by using DHF, SC1 and SC2 in order, to remove the natural oxidation layer and the pollutant on the surface of the silicon wafer, and then manufacturing the second silicon oxide layer on the surface of the low-resistivity silicon wafer.

8. The method of manufacturing thin film of claim 1, wherein in step (2), the process for manufacturing the second silicon oxide layer on low-resistivity silicon wafer comprises: putting the low-resistivity silicon wafer in the oxidation oven where the oxidation temperature is 950-1020° C., controlling the thickness of the obtained second silicon oxide layer according to the oxidation time; and then cleaning the low-resistivity silicon wafer with the manufactured second silicon oxide layer by using SC1 and SC2 in order, to remove the pollutant on the surface.

9. The method of manufacturing thin film of claim 1, wherein in step (6), the process of cleaning the SOI wafer with the amorphous layers obtained after separation is cleaning by using SPM, DHF, SC1 and SC2 in order, to remove the silicon slag and other pollutants on the surface of SOI.

* * * * *